(12) United States Patent
Frech et al.

(10) Patent No.: US 8,519,720 B2
(45) Date of Patent: Aug. 27, 2013

(54) METHOD AND SYSTEM FOR IMPEDANCE MEASUREMENT IN AN INTEGRATED CIRCUIT

(75) Inventors: Roland Frech, Ostfildern (DE); Jochen Supper, Herrenberg (DE); Thomas-Michael Winkel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 314 days.

(21) Appl. No.: 13/087,602

(22) Filed: Apr. 15, 2011

(65) Prior Publication Data

US 2012/0013353 A1 Jan. 19, 2012

(30) Foreign Application Priority Data

Jul. 14, 2010 (EP) .................................. 10169505

(51) Int. Cl.
*G01R 27/28* (2006.01)
(52) U.S. Cl.
USPC ........................................................ 324/649
(58) Field of Classification Search
USPC ................... 324/649, 762.01–762.1, 764.01, 324/765.01; 257/48; 438/14–18
See application file for complete search history.

(56) References Cited

U.S. PATENT DOCUMENTS

| | | |
|---|---|---|
| 6,768,952 B2 | 7/2004 | Kantorovich et al. |
| 6,911,827 B2 | 6/2005 | Kantorovich et al. |
| 7,203,608 B1 | 4/2007 | Aikawa et al. |
| 7,746,084 B2 * | 6/2010 | Belkhayat et al. ............ 324/649 |
| 8,362,789 B2 * | 1/2013 | Collins et al. ................. 324/649 |
| 2002/0125897 A1 | 9/2002 | Frech et al. |
| 2005/0110551 A1 | 5/2005 | Bonaccio et al. |
| 2008/0211472 A1 | 9/2008 | Barrows et al. |

FOREIGN PATENT DOCUMENTS

| | | |
|---|---|---|
| EP | 0240102 A3 | 10/1987 |
| WO | 2008097213 | 8/2008 |

OTHER PUBLICATIONS

G Taylor et al., "An Approach to measuring power supply impedance of microprocessors", Electrical Performance of Electronic Packaging, 2001, Oct. 29, 2001, 1 page of Abstract downloaded from Internet at URL: <http://ieeexplore.ieee.org/xpl/freeabs_all.jsp?arnumber=967648>.
Waizman, "Integrated Power Supply Frequency Domain Impedance Meter (IFDIM)", IEEE Xplore, Oct. 25, 2004, pp. 217-220.

* cited by examiner

*Primary Examiner* — Tung X Nguyen
(74) *Attorney, Agent, or Firm* — Walter W. Duft

(57) ABSTRACT

A method for determining a power supply impedance profile ($|Z(f)|$) at a predetermined load location within an electronic system. A repetitive activity (such as a modulated clock tree signal) is applied in the load location, and the local power supply voltage ($U(t)$) caused by this repetitive activity is measured. Rather than measuring the corresponding current consumption ($I(t)$) caused by the repetitive activity, the current consumption is calculated analytically. The local power supply impedance profile ($|Z(f)|$) is calculated as the ratio of the frequency-domain voltage and current consumption magnitudes ($|U(f)|$, $|I(f)|$) of the measured power supply voltage ($U(t)$) and the calculated current consumption ($I(t)$).

25 Claims, 5 Drawing Sheets

METHOD AND SYSTEM FOR IMPEDANCE MEASUREMENT IN AN INTEGRATED CIRCUIT

FIELD OF THE INVENTION

The present invention relates generally to integrated circuits and in particular to a method and a system for measuring local power supply impedance in microprocessor chips, circuit boards and electronic packaging.

BACKGROUND OF THE INVENTION

Modern integrated circuits (ICs) are known to consume high current in a wide frequency range which has to be reliably provided by the IC power supply in order to ensure IC functionality. Therefore, power supply and its distribution is a critical item in high end electronic designs that need to fulfill ambitious requirements with respect to reliability and low impedance. IC design and implementation is complex and requires deep insight into the frequency-dependence of the operating behavior which, in turn, is influenced by board and package design. In particular, the IC's power supply network structure has to reliably provide sufficient power in each individual load location within the system. A variety of power domains need to be taken into account, and stable supply voltage levels have to be ensured at each load, independently of its actual current demand. In order to provide the desired functionality for the IC under consideration, there is a need for an unbiased verification methodology that is able to verify power supply functionality and robustness during early VLSI tests, first module tests, as well as final compound operation in a system environment. This power supply verification methodology should be quantitative, must disclose interference, and must provide guidance to specific improvements. Also, the analysis method must be applicable for model-to-hardware verification.

Typically, power supply voltage integrity is measured in the time domain at a load location subject to selected power demand conditions. The power supply voltage excursions depend mostly on the specific operational power demand and therefore do not overall reveal general power supply distribution properties such as, e.g., the power supply impedance profile.

A correctly scaled power supply impedance profile $Z(f)$, which expresses the impedance of the power supply as a function of frequency $f$, is a quantitative measure of specific local power supply network properties. In order to determine the power supply impedance profile $Z(f)$ at a specific load location within the system, the associated voltage and current spectra $U(f)$, $I(f)$ at the location have to be determined. Compared to current measurements, local power supply voltage $U(t)$ can be measured easily as a function of time and transformed into the frequency domain. Measurement of local power supply current $I(t)$, however, is difficult and error-prone, leading to inaccuracies of the Fourier transform $I(f)$ of the current thus measured. As a consequence, evaluation of the power supply impedance $Z(f)$, as calculated from the ratio of the voltage and current spectra $U(f)$, $I(f)$, is not very accurate, especially in VLSI designs.

U.S. Pat. No. 6,768,952 describes a method for determining the impedance of a system by measuring current at various clock frequencies. The clock frequency is toggled between two frequencies, thereby generating a periodic current waveform, and the clock frequency dependent voltage noise is measured. This method is quite cumbersome and error-prone since it requires manual filtering and multiple measurements to determine the impedance profile over a wide frequency range.

U.S. Pat. No. 7,203,608 discloses a method for measuring power supply impedance in the frequency domain by applying a power supply pseudo current impulse and measuring the power supply voltage. The current is derived from a measurement of the switching charge. This pseudo current impulse is difficult to create and control, and a measurement of switching charge during the current impulse is complicated and error-prone.

U.S. Pat. No. 6,911,827 describes a method for determining the impedance of a microprocessor by generating current levels at a predetermined number of different clock frequencies and determining an impedance of the microprocessor power supply by dividing a Fourier component of the filtered average voltage by a Fourier component of the periodic current waveforms. Again, this method is cumbersome and error-prone, since it involves manual filtering and multiple measurements to determine the impedance profile.

Publication "Integrated Power Supply Frequency Domain Impedance Meter (IFDIM)" by Alex Waizman et al. (in: IEEE 13$^{th}$ Topical Meeting on Electronic Performance of Electronic Packaging 2004, p. 217-220) discloses a method for determining a power supply impedance profile over a wide frequency range for an electronic chip (specifically: a CPU) by using clock tree amplitude modulation. The method comprises steps of:

1. periodically modulating the clock tree on and off, thus causing a quasi square wave current demand $I(t)$ by the chip;
2. determining a square wave dynamic current consumption using a measurement of voltage drop across a shunt resister in a voltage regulator pathway at a low modulation frequency, and further calculating current amplitudes associated with harmonic components of the modulation frequency;
3. performing a Fourier decomposition of the square wave current consumption, thus yielding $I(f)$;
4. measuring CPU power supply voltage values $U(t)$ for the corresponding chip activities as a function of time;
5. transforming the measured CPU power supply voltage values $V(t)$ into a frequency domain voltage signature $U(f)$;
6. repeating steps 4 and 5 over plural clock tree modulation frequencies; and
7. evaluating the power supply impedance profile $Z(f)=U(f)/I(f)$.

While this method enables a determination of a local power supply impedance profile $Z(f)$, it is cumbersome since it requires an additional shunt resistor close to the power supply for carrying out a current measurement. Moreover, in order to obtain high measurement accuracy, multiple modulations of the clock tree with different modulation frequencies are required, and many measurement cycles have to be carried out.

Thus, there is a need for a simpler method for determining the power supply impedance profile $Z(f)$ with high accuracy.

SUMMARY OF THE INVENTION

According to a first aspect of the invention, a method for determining a power supply impedance profile versus frequency in a predetermined load location within an electronic system is provided. The method comprises: (1) applying a repetitive activity at the load location at a selected duty cycle; (2) evaluating the temporal behavior of a current consumption caused by the repetitive activity at the load location using an analytic technique that evaluates a selected number of harmonic components of the current consumption, (3) the repetitive activity duty cycle and the selected number of harmonic components being chosen to influence impedance profile accuracy; (4) calculating a corresponding frequency-domain current consumption profile (I(f)); (5) measuring a local power supply voltage (U(t)) caused by the repetitive activity at the load location; (6) evaluating a frequency-domain voltage profile (U(f)) of the measured local power supply voltage (U(t)); and (7) calculating the local power supply impedance profile (|Z(f)|) from the magnitudes (|U(f)|, |I(f)|) of the voltage and current profiles (U(f), I(f)).

According to a second aspect of the invention, a system for determining a power supply impedance profile in a predetermined load location within an electronic system is provided. The system comprises: (1) means for applying a repetitive activity at the load location at a selected duty cycle; (2) means for evaluating the temporal behavior of a current consumption caused by the repetitive activity at the load location using an analytic technique that evaluates a selected number of harmonic components of the current consumption; (3) the repetitive activity duty cycle and the selected number of harmonic components being chosen to influence impedance profile accuracy; (4) means for calculating a corresponding frequency-domain current consumption profile (I(f)); (5) means for measuring a local power supply voltage (U(t)) caused by the repetitive activity at the load location; (6) means for evaluating a frequency-domain voltage profile (U(f)) of the measured local power supply voltage (U(t)); and (7) means for calculating the local power supply impedance profile (|Z(f)|) from the magnitudes (|U(f)|, |I(f)|) of the voltage and current profiles (U(f), I(f)).

BRIEF DESCRIPTION OF THE DRAWINGS

The present invention together with objects and advantages thereof may best be understood from the following detailed description of example embodiments, but not restricted to the embodiments, wherein is shown in:

FIG. 1b a schematic plan view of the electronic system of FIG. 1a;

FIG. 4 a diagram of a voltage measurement as carried out at a specific location on the chip of FIG. 1a;

Figure 1A:
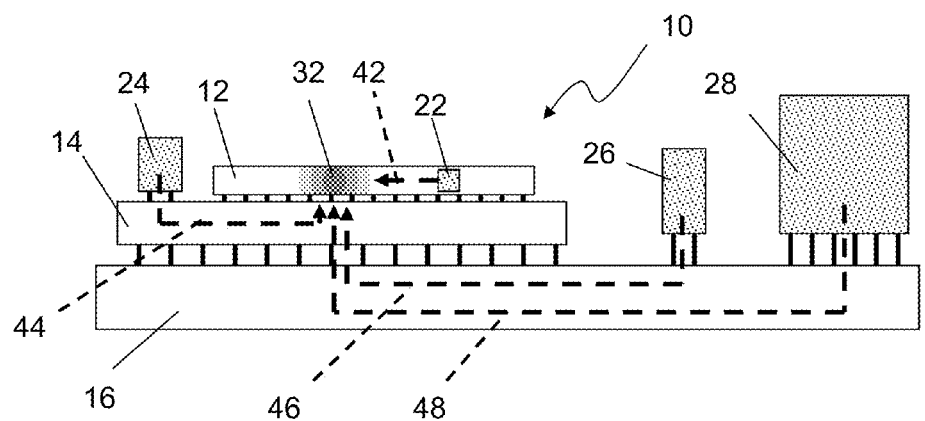
FIG. 1a a schematic sectional view of an electronic system comprising an integrated circuit chip mounted on a circuit board.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

DETAILED DESCRIPTION OF EXAMPLE EMBODIMENTS

Figure 1B:
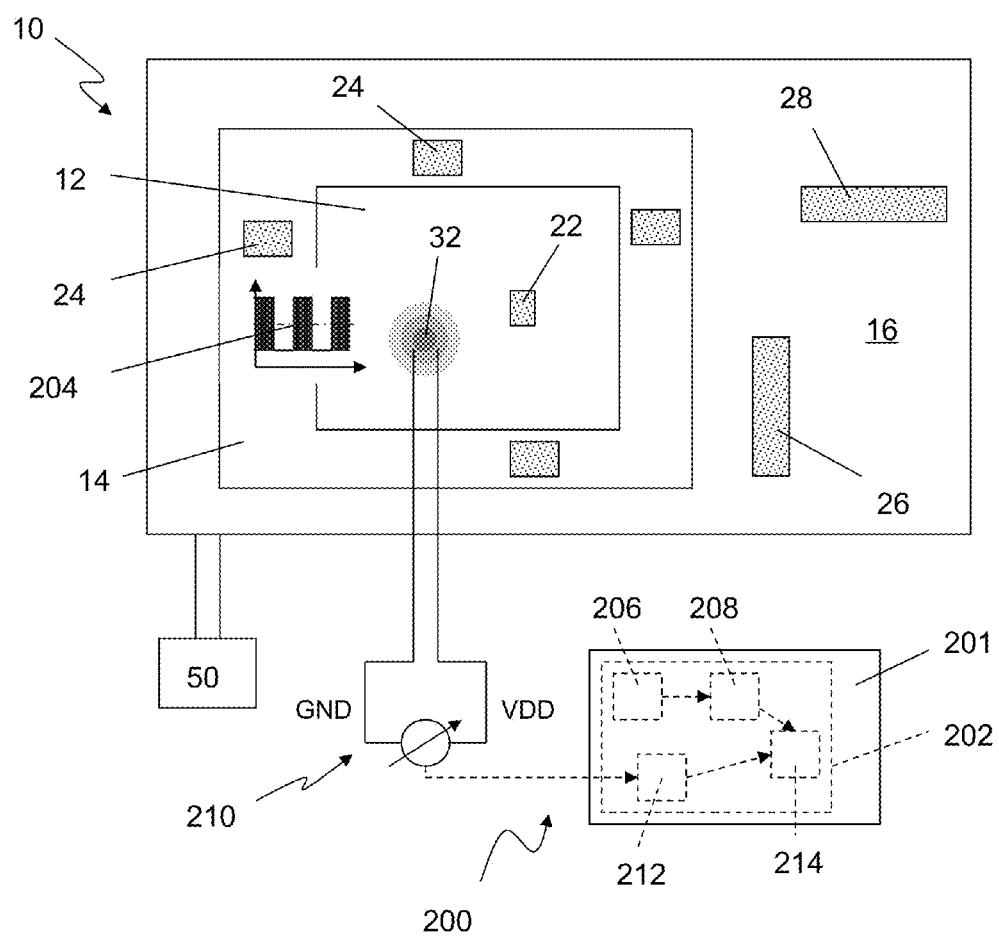

FIG. 1a displays a schematic sectional view of an electronic system 10 comprising an integrated circuit (IC) chip 12. A schematic plan view of this electronic system 10 is depicted in FIG. 1b. The chip is mounted on a carrier 14 which, in turn, is mounted on a circuit board 16. Decoupling capacitors 22, 24 and 26, and a DC voltage regulator 28, are provided on the chip 12, the carrier 14 and the circuit board 16. There are also one or more load locations 32 on the chip 12 where various chip functions are performed. Decoupling capacitors 22, 24 and 26 are respectively connected to the illustrated load location 32 via wiring 42 on chip 12, wiring 44 on carrier 14, and wiring 44 on circuit board 16. Voltage regulator 28 connects to load location 32 via wiring 48 on circuit board 16. A system power supply 50 provides D.C. power to the circuit board 16.

In order to ensure reliable operation of all functions within chip 12, it is mandatory that sufficient power be provided for each individual load location 32 within the chip 12. In particular, the load functionality residing at a specific location 32 within chip 12 requires that adequate power be supplied to such location, at all operational frequencies to be expected, in order for the load functionality to perform as specified.

The power supply network properties at a specific location 32 of chip 12 may be assessed by measuring the local power supply impedance profile Z(f) as a function of frequency f. This power supply impedance profile Z(f) is defined as the ratio of the magnitude of the associated voltage and current spectra U(f), I(f) at the location 32: $|Z(f)|=|U(f)|/|I(f)|$. The power supply impedance profile Z(f) is a specific property of any distribution network and is useful for quantitatively assessing power supply network properties at the location 32 of a specific load within chip 12. The power supply impedance profile Z(f) at load location 32 depends on frequency f, packaging infrastructure, decoupling hierarchy, individual local geometry as well as component interactions (resonances). An evaluation of power supply impedance Z(f) at a specific location 32 in chip 12 requires accurate evaluation of current I and voltage U at this location.

Figure 2:
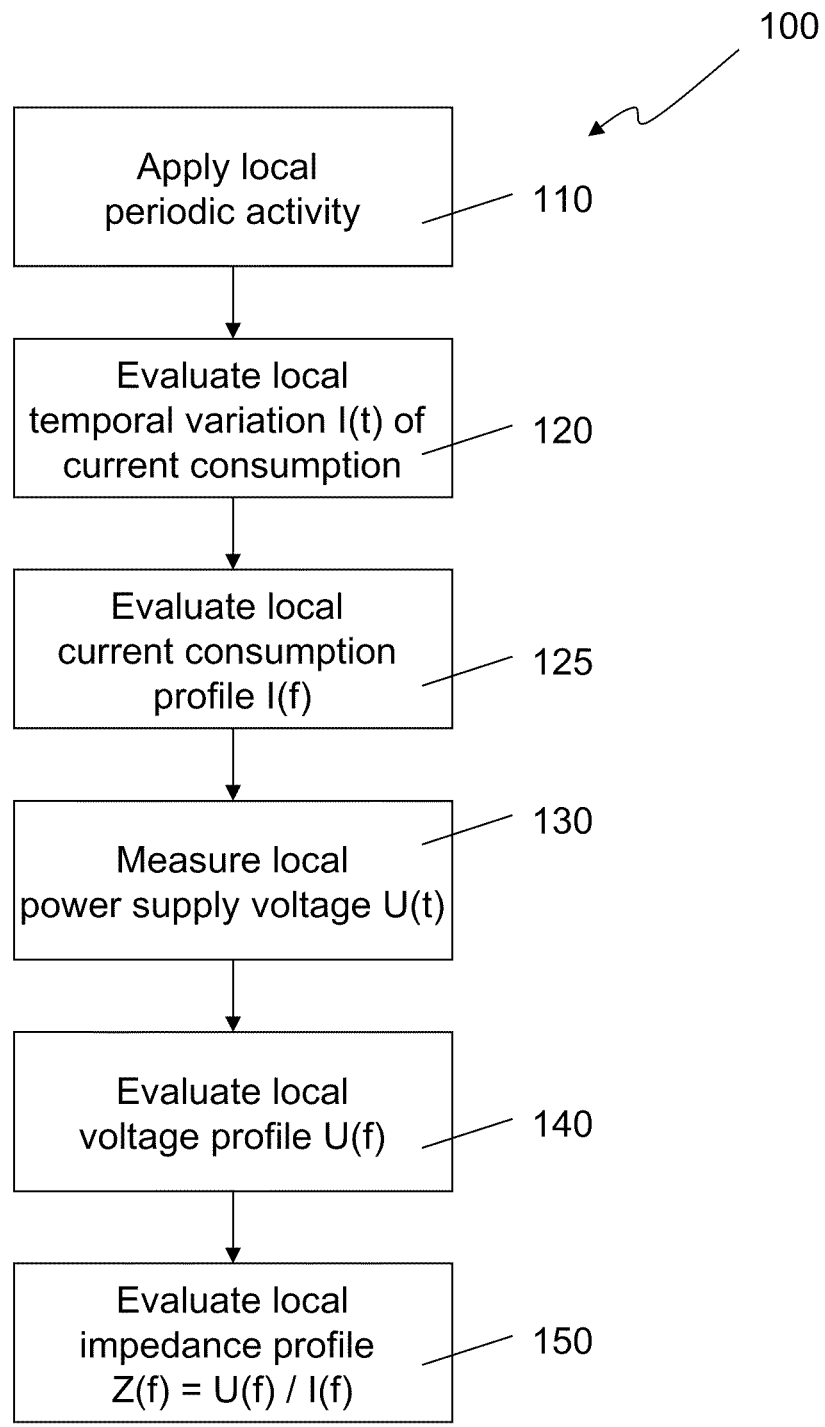
FIG. 2 a schematic flow diagram of a method for determining a local power supply impedance profile.

A schematic flow diagram of a preferred method 100 for determining power supply impedance profile Z(f) at a location 32 within chip 12 is shown in FIG. 2. According to the method 100, a periodic activity is applied to chip 12 in such a way that a well-defined amount of power is dissipated at the location 32 under consideration (step 110). The local temporal variation I(t) of the current consumption due to this periodic activity is evaluated using an analytic technique in step 120, and its Fourier transform I(f) is computed in step 125. The voltage U(t) resulting from this periodic activity is measured in step 130, and the corresponding frequency profile U(f) is computed in step 140. Once I(f) and U(f) have been determined in steps 125, 140, the local power supply distribution impedance profile Z(f) is computed in step 150.

Method 100 is based on the experience that it is relatively easy to carry out local voltage measurements U(t) with high accuracy and high temporal resolution, while measurements of the current I(t) are difficult and error-prone. Rather than relying on a inaccurate current measurement, method 100 makes use of the fact that current consumption due to a well-defined, periodically varying load at a location 32 within chip 12 can be easily calculated. Therefore, in order to obtain a reliable and quantitatively precise power supply current determination at a specific location 32 under consideration, a periodic activity of the chip 12 is applied and an analytic technique is used to calculate the temporal behavior of the current consumption resulting from the periodic activity. Only two actual current measurements are used and these are easy to obtain because they are made under quasistatic conditions.

The periodic activity may consist of periodically switching on and off the clock tree, so that the clock tree (with frequency $f_{clk}$) is superposed with a 100% clock tree amplitude modulation of frequency $f_{mod}$. The clock tree constitutes a very simple and highly reproducible signal and is present in any IC so that no additional excitation has to be designed and introduced. Clock toggling generates a high percentage of maximum dynamic current consumption in a typical IC and thus constitutes a well-suited excitation of chip 12. Moreover, the clock network and master/slave flip flops are distributed across the entire chip 12 and consume considerable amounts of current, so that a stimulus making use of the clock network will create a power consumption spectrum which is representative of the couplings within electronic system 10 and which preserves interactions between the on-chip 12 decoupling, packaging 14 and circuit board 16 power delivery networks.

Figure 3A:
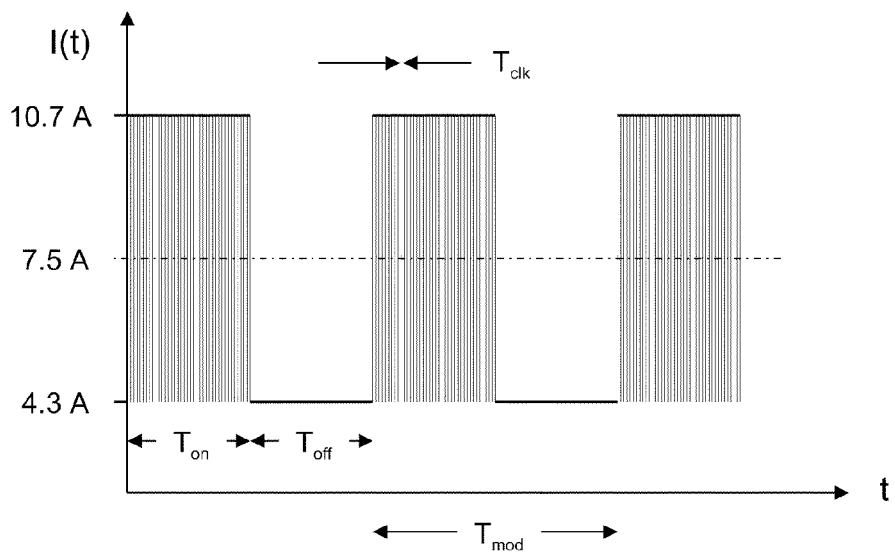
FIG. 3a a schematic diagram of local current consumption due to a clock activity which is symmetrically switched ON and OFF.

FIG. 3a shows a schematic diagram of a current consumption due to an excitation by a clock signal modulated with a square wave. By way of example, the clock signal may have a frequency $f_{clk}$=800 MHz and may be periodically switched on and off, i.e. modulated with a square wave having a modulation frequency $f_{mod}$=1 MHz. According to this example, the period $T_{mod}$ of modulation would about 1 μs while the clock period $T_{clk}$ would be about 1.25 ns.

The local temporal variation I(t) of current consumption due to this square wave modulated clock excitation may be expressed as $$I(t) = (I_{leak} + I_0) + \qquad (A)$$
$$I_0 \cdot \left( \frac{4}{\pi} \cdot \sin\Omega_{mod}t + \frac{4}{3\pi} \cdot \sin3\Omega_{mod}t + \frac{4}{5\pi} \cdot \sin5\Omega_{mod}t + \dots \right)$$

where $I_{leak}$ is the leakage current without the clock signal applied (in the example of FIG. 3a, $I_{leak}$=4.3 A), $I_0$ is an active current representing one-half of the current amplitude with the clock signal applied (in the example of FIG. 3a, $I_0$=3.2 A), and $\Omega_{mod}$=2π$f_{mod}$. The elements within the parentheses (from left to right) respectively represent the base modulation frequency $f_{mod}$ and its $3^{rd}$ and $5^{th}$ harmonics. Higher harmonics may also be included and this will yield advantages as discussed in more detail below. Note that the harmonics of equation (A) are odd harmonics. As further discussed below, a technique for obtaining additional current consumption data using even harmonics may also be used.

The power supply current demand of both modulation states (i.e. parameters $I_{leak}$ and $I_0$) can be determined from a quasistatic measurement. The $I_{leak}$ current may be obtained from a current measurement without clock activity, whereas the $I_0$ current may be obtained from a current measurement with a continuously operating clock. Both current values $I_{leak}$, $I_0$ can be determined using a simple ampere meter or taking a reading of a current gauge of the system power supply 50.

Figure 3B:
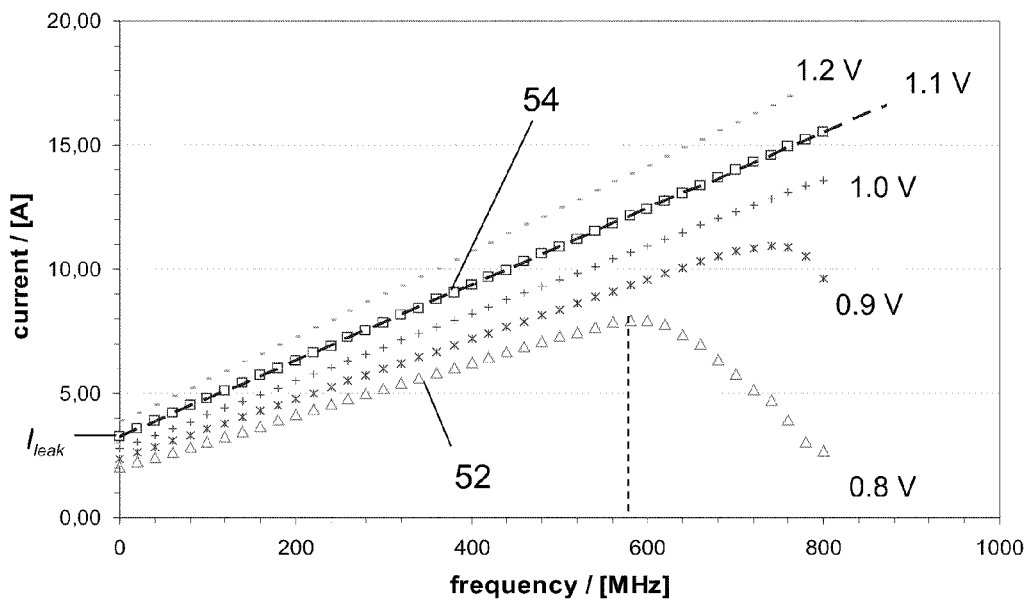
FIG. 3b a plot of an average operating current due to a continuous clock signal activation, as a function of clock frequency for various operating voltages.

In this context, note that the dependence of the average current on clock frequency will yield information on whether the load at the specific location 32 is functioning (i.e. consuming current) as specified. As an example, FIG. 3b shows plots of average current consumption at a location 32 due to clock signal activation, as a function of clock frequency, for various operating voltages applied to the load at the location of interest. A linear dependence such as curve 54 indicates correct clocking of the load, whereas a nonlinearity as exhibited in curve 52 (which declines at higher frequencies) indicates that the load is unable to follow the clock tree at high clock frequencies (in the case of curve 52, at clock frequencies beyond 600 MHz). This indicates that insufficient power is supplied to the load at the location 32 under consideration and can be remedied by increasing operating voltage. Plots such as the one shown in FIG. 3b may thus be used to detect inaccuracies (or even failure) of method 100 due to insufficient supply voltage at load location 32. Note also that the leakage current $I_{leak}$ can be directly determined from the plots of FIG. 3b as the operating current at clock frequency zero.

Figure 5:
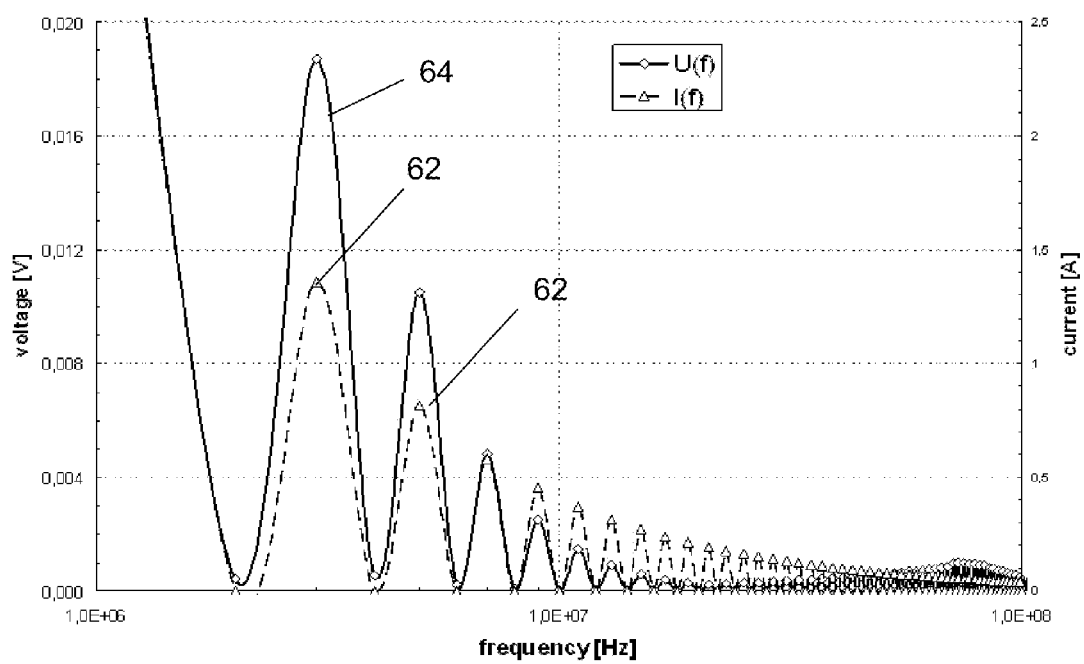
FIG. 5 a diagram of Fourier transforms of operating voltage and current.

Once $I_0$ and $I_{leak}$ have been determined, the complete functional dependence of the power supply current consumption as a function of time I(t) may be computed analytically (step 120). A Fourier series expansion of the time-domain current I(t) into the frequency domain yields the current spectrum I(f) (step 125). The resulting Fourier components are depicted as a set of values denoted by triangular symbols 62 (and joined by a dotted line) in FIG. 5.

Note that in order for the current consumption I(t) at a location 32 to be accurately described by the formula (A) as cited above, it is desired that during execution of the impedance measurement method 100, the periodic switching of the clock tree be the only power demanding activity on the chip 12; i.e. no other concurrent chip activities should be carried out at the same time.

Figure 4:
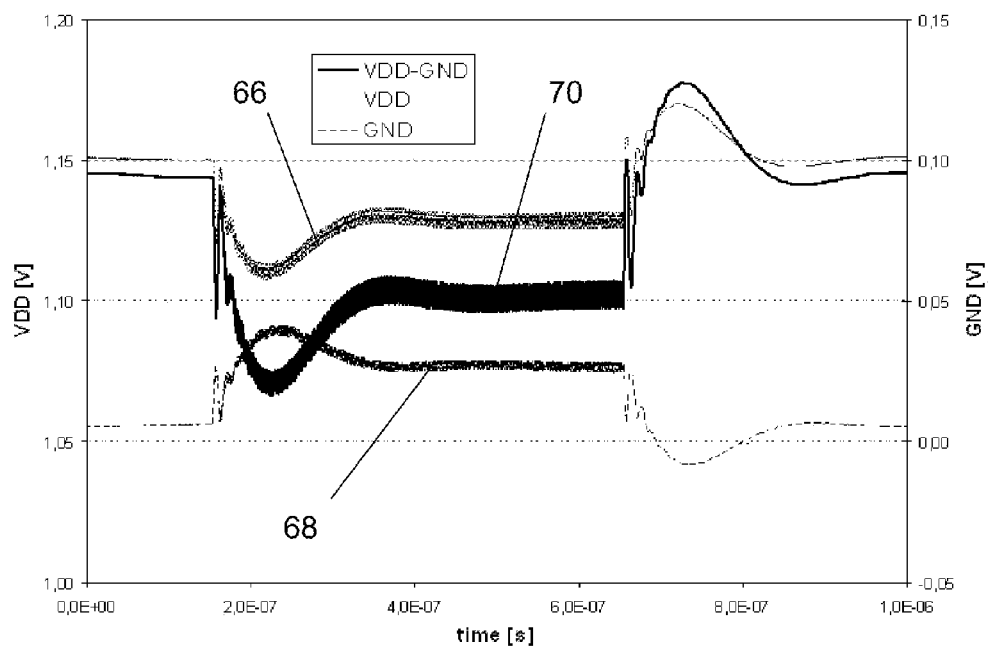

The signature of the local on-chip power supply voltage U(t) during an operational mode in which clock modulation is the only activity of electronic system 10 is measured (step 130), e.g. by using an oscilloscope 210. As shown in FIG. 1b, this power supply voltage U(t) measurement is carried out in the specific location 32 in which the power supply profile is to be determined. FIG. 4 shows an example graph 70 of net (i.e. local) supply voltage U(t) corresponding to a difference between VDD (curve 66) and GND (curve 68) as obtained from voltage measurements carried out by oscilloscope 210 at location 32. A Fourier transform of U(t) into frequency domain yields voltage spectrum U(f) (step 140). An example of a result of this Fourier transform is shown as a curve 64 in FIG. 5.

Figure 6:
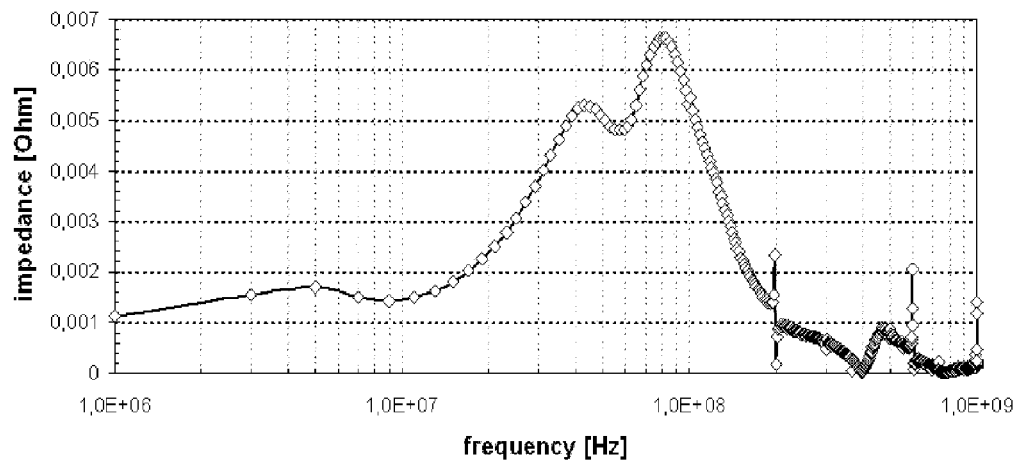
FIG. 6 a diagram of a power supply impedance profile as a function of frequency, as determined from the Fourier transforms of FIG. 5.

Once the power supply current spectrum I(f) and the power supply voltage spectrum U(f) have both been determined in steps 125, 140, they can be used for calculating the desired power supply impedance $|Z(f)|=|U(f)/I(f)|$ at the specific location 32 on the chip 12 (step 150). The result is the frequency dependence of the magnitude of the power supply distribution $|Z(f)|$, as computed from the ratio of the $|I(f)|$ and corresponding $|U(f)|$ values shown in FIG. 5. This is displayed in FIG. 6.

Note that the clock modulation technique of FIG. 3a, which represents one example of a periodic activity of chip 12 that may be used for precise power supply current determination, is symmetric in the sense that the "on-time" $T_{on}$ and the "off-time" $T_{off}$ have the same duration. As a consequence, the Fourier decomposition of the time-dependent current consumption I(t) contains only odd harmonics of the modulation frequency $f_{mod}$. The number of measurement points can be increased by choosing the clock duty cycle to be non-symmetrical (so that $T_{on} \neq T_{off}$) and generating additional data for the time-dependent current consumption I(t). This will result in a spectrum containing both even and odd harmonics of the modulation frequency $f_{mod}$, which will increase the number of measurement points for the impedance curve Z(f) by a factor of two and thus improve measurement statistics. A non-symmetrical duty cycle also yields relatively higher signal amplitudes and thus decreases evaluation errors.

If only the base frequency and the $3^{rd}$ and the $5^{th}$ harmonics shown in formula (A) are used for evaluating I(t), a set of various modulation frequencies may need to be applied and multiple measurements and evaluations may need to be carried out in order to cover a large frequency range for Z(f). This can be avoided by evaluating a larger number of harmonics—preferentially all harmonics up to the vertical (i.e. S/N ratio) and frequency resolution of the oscilloscope, which poses a limit on the time resolution of U(t). If a large number of harmonics is evaluated, high measurement accuracy can be achieved by using only a single modulation frequency (rather than using a sequence of multiple modulation frequencies). Since only one modulation frequency is used, only one measurement cycle is required for obtaining all measurement points necessary for evaluating Z(f).

The power supply impedance spectrum of Z(f) can thus be determined with a very high accuracy in a frequency range between the modulation frequency $f_{mod}$ up to the clock frequency $f_{clk}$. In order to be able evaluate the power supply impedance profile Z(f) over a wide frequency range, the applied clock modulation frequency $f_{mod}$ should be chosen as low as possible (and may be chosen as low as 100 Hz), whereas the clock frequency $f_{clk}$ itself should be as high as possible. Depending on the measurement equipment used for determining voltage, signal sampling properties may force the sequential use of multiple modulation/clock frequency pairs in order to attain the overall required evaluation frequency range.

Figure 7:
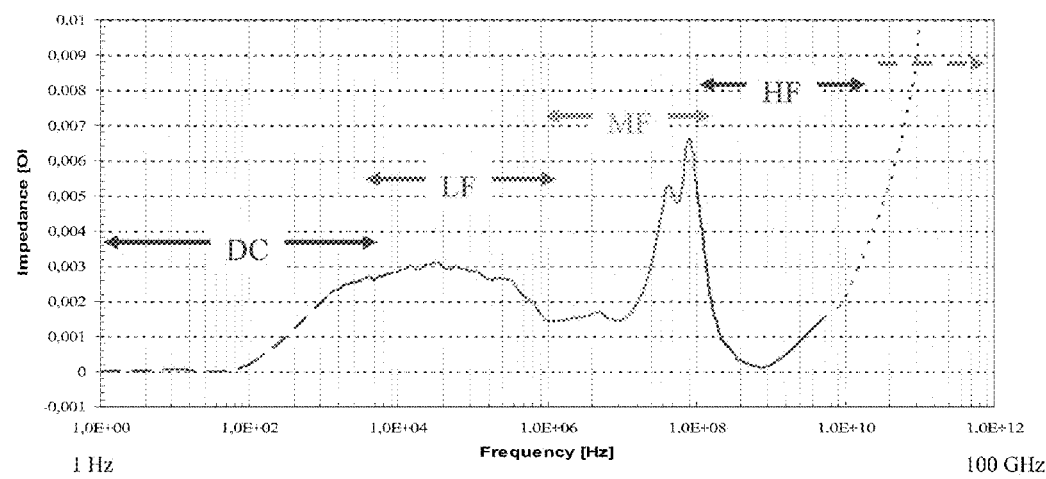
FIG. 7 a diagram of a power supply impedance profile over a wider range of frequencies.

Generally, the frequency dependence of the power supply impedance profile Z(f) yields information on specific properties of the various network portions within electronic system 10. This is schematically shown in FIG. 7 which displays a typical Z(f) profile in the range between 100 Hz and 10 GHz. In a quasistatic region marked by "DC", the frequency behavior of power supply impedance profile Z(f) is largely determined by the voltage regulator 28 and the voltage regulation loop that includes wiring 48 on circuit board 16 (see FIG. 1a). In a low frequency region marked by "LF", power supply impedance behavior is dominated by low frequency decoupling capacitors 26 and the wiring 46 on circuit board 16. In the adjacent mid frequency region marked by "MF", power supply impedance behavior is largely determined by mid frequency decoupling capacitors 24 and the wiring 44 on carrier board 14. In the high frequency region marked by "HF", power supply impedance behavior is influenced mostly by on-chip decoupling properties (due to capacitors 22, circuits, the wiring 42 on chip 12, etc.).

Method 100 constitutes a standardized method for verifying local power supply properties in an electronic device and can be used for a quantitative evaluation of power distribution networks over a large frequency range. The method is load independent and thus furnishes a power supply "fingerprint" at the specific location 32 under consideration. The impedance network signature Z(f) is location-specific in the sense that power supply network signatures Z(f) in different locations will typically display a different behavior. An impedance network signature Z(f) as determined by method 100 may be compared to simulations and/or analytical models of power supply impedance, thus verifying or refuting design properties of the chip 12. Method 100 may be applied during chip and module testing for early design feedback with respect to on-chip (HF) and on-module (MF) power supply distribution properties. In particular, using method 100, prototype chips may be evaluated with respect to their power supply distribution at an early stage during IC design, so that, for example, decoupling capacitors 22, 24 may be placed and dimensioned appropriately.

Method 100 is also applicable in a system environment for verifying DC and LF power supply performance, e.g. as part of hardware verification during machine power-up. In this case, means for executing method 100 may be integrated into chip 12 and/or electronic connections may be provided in chip 12 for enabling measurements to be conducted by measurement means located in the carrier 14. The Z(f) results obtained by executing method 100 may be used as guidelines for specific optimization with respect for yield an system application.

Method 100 enables a highly reproducible local assessment of Z(f) and thus provides reliable parameters for model synthesis and for evaluation of model-to-hardware correlations.

Note that, besides using the clock tree, it is also possible to periodically execute a specific functionality (function) which is known to make use of electronic components at a specific location 32 and thus imposes a periodic load on the power supply at such location.

Returning now to FIG. 1B, there is schematically shown an example system 200 for determining power supply impedance Z(f) at a location 32 on chip 12. System 200 comprises a clock signal generator/modulator 204 for applying a repetitive activity at the location 32. System 200 also includes an oscilloscope 210 for measuring local power supply voltage U(t) as caused by the periodic activity. Moreover, system 200 comprises a computer system 201 with a memory and a logic system 202. As depicted, logic system 202 generally includes a current evaluation system 206, a Fourier decomposition system 208, a Fourier transform system 212 and an impedance evaluation system 214. These systems shown herein carry out the functions described above:

Current evaluation system 206 calculates (using the above-described analytic technique) the temporal behavior of the local current consumption I(t) caused by activity generator/modulator 204;

Fourier decomposition system 208 furnishes the corresponding current consumption profile I(f);

Fourier transform system 212 calculates the Fourier transform U(f) of the local power supply voltage U(t) at location 32, as measured by oscilloscope 210; and Impedance evaluation system 214 evaluates the local power supply impedance profile Z(f) from the voltage and current profiles U(f), I(f).

Accordingly, a method and system for impedance measurement in an integrated circuit have been disclosed. Although various embodiments have been disclosed, it should be apparent that many variations and alternative embodiments would be apparent to those skilled in the art in view of the teachings herein. It is understood, therefore, that the invention is not to be in any way limited except in accordance with the spirit of the appended claims and their equivalents.

The invention claimed is:

1. A method for determining a local power supply impedance profile (|Z(f)|) at a predetermined load location within an electronic system, comprising:

applying a repetitive activity to said load location at a selected duty cycle;

evaluating a temporal behavior of a current consumption (I(t)) caused by said repetitive activity at said load location using an analytic technique that evaluates a selected number of harmonic components of said current consumption;

said repetitive activity duty cycle and said selected number of harmonic components being chosen to influence impedance profile accuracy;

calculating a corresponding frequency-domain current consumption profile (I(f));

measuring a local power supply voltage (U(t)) caused by said repetitive activity at said load location;

evaluating a frequency-domain voltage profile (U(f)) of said measured local power supply voltage (U(t)); and calculating said local power supply impedance profile (|Z(f)|) from the magnitudes (|U(f)|, |I(f)|) of said voltage and current profiles (U(f), I(f)).

2. The method according to claim 1, wherein said applying a repetitive activity comprises periodically switching a system clock tree on and off.

3. The method according to claim 1, wherein said repetitive activity has a symmetrical duty cycle.

4. The method according to claim 1, wherein said repetitive activity has a non-symmetric duty cycle.

5. The method according to claim 1, wherein said repetitive activity has symmetric duty cycle during one phase of determining said power supply impedance to facilitate evaluation of odd-numbered harmonic components of said current consumption, and wherein said repetitive activity has a non-symmetric duty cycle during a second phase of determining said power supply impedance to facilitate evaluation of even-numbered harmonic components of said current consumption.

6. The method according to claim 1, wherein said evaluating a temporal behavior of a current consumption (I(t)) comprises quasistatic measurements of a leakage current ($I_{leak}$) obtained without said repetitive activity being applied and an active current ($I_0$) obtained with said repetitive activity being applied.

7. The method according to claim 6, wherein said active current ($I_0$) represents one-half of a current consumed at said load location due to said repetitive activity being applied.

8. The method according to claim 6, wherein said evaluating a temporal behavior of a current consumption (I(t)) further comprises said leakage current ($I_{leak}$) and said active current ($I_0$) being utilized in an equation that includes a frequency of said repetitive activity and plural harmonics thereof.

9. The method according to claim 1, wherein said repetitive activity has a characteristic frequency while it is applied and wherein said evaluating said temporal behavior of a current consumption (I(t)) comprises said analytic technique evaluating all harmonic components of said current consumption up to said characteristic frequency of said repetitive activity.

10. The method according to claim 1, wherein said evaluating a temporal behavior of a current consumption (I(t)) comprises said analytic technique evaluating all harmonic components of said current consumption up to a maximum frequency of a measuring device used for measuring said local power supply voltage (U(t)).

11. A system for determining a power supply impedance profile (|Z(f)|) at a predetermined load location (32) within an electronic system (10), comprising:

means for applying a repetitive activity to said load location at a selected duty cycle;

means for evaluating a temporal behavior of a current consumption (I(t)) caused by said repetitive activity at said load location using an analytic technique that evaluates a selected number of harmonic components of said current consumption;

said repetitive activity duty cycle and said selected number of harmonic components being chosen to influence impedance profile accuracy;

means for calculating a corresponding frequency-domain current consumption profile (I(f));

means for measuring a local power supply voltage (U(t)) caused by said repetitive activity at said load location;

means for evaluating a frequency-domain voltage profile (U(f)) of said measured local power supply voltage (U(t)); and means for calculating said local power supply impedance profile (|Z(f)|) from the magnitudes (|U(f)|, |I(f)|) of said voltage and current profiles (U(f), I(f)).

12. The system according to claim 11, wherein said means for applying a repetitive activity comprises means for periodically switching a system clock tree on and off.

13. The system according to claim 11, wherein said means for applying a repetitive activity applies a repetitive activity having a symmetrical duty cycle.

14. The system according to claim 11, wherein said means for applying a repetitive activity applies a repetitive activity having a non-symmetric duty cycle.

15. The system according to claim 11, wherein said means for applying a repetitive activity applies a repetitive activity having a symmetric duty cycle during one phase of determining said power supply impedance to facilitate evaluation of odd-numbered harmonic components of said current consumption, and wherein said means for applying a repetitive activity applies a repetitive activity having a non-symmetric duty cycle during a second phase of determining said power supply impedance to facilitate evaluation of even-numbered harmonic components of said current consumption.

16. The system according to claim 11, wherein said means for evaluating a temporal behavior of a current consumption (I(t)) comprises means for obtaining quasistatic measurements of a leakage current ($I_{leak}$) without said repetitive activity being applied and an active current ($I_0$) obtained with said repetitive activity being applied.

17. The system according to claim 16, wherein said active current ($I_0$) represents one-half of a current consumed at said load location due to said repetitive activity being applied.

18. The system according to claim 16, wherein said means for evaluating a temporal behavior of a current consumption (I(t)) further comprises means for utilizing said leakage current ($I_{leak}$) and said active current ($I_0$) in an equation that includes a frequency of said repetitive activity and plural harmonics thereof.

19. The system according to claim 11, wherein said repetitive activity has a characteristic frequency while it is applied and wherein said means for evaluating said temporal behavior of a current consumption (I(t)) comprises means for using said analytic technique to evaluating all harmonic components of said current consumption up to said characteristic frequency of said repetitive activity.

20. The system according to claim 11, wherein said means for evaluating a temporal behavior of a current consumption (I(t)) comprises means for using said analytic technique to evaluate all harmonic components of said current consumption up to a maximum frequency of a measuring device used for measuring said local power supply voltage (U(t)).

21. A method for determining a local power supply impedance profile (|Z(f)|) at a predetermined load location within an electronic system, comprising:

applying a repetitive activity to said load location;

evaluating a temporal behavior of a current consumption (I(t)) caused by said repetitive activity at said load location using an analytic technique;

calculating a corresponding frequency-domain current consumption profile (I(f));

measuring a local power supply voltage (U(t)) caused by said repetitive activity at said load location;

evaluating a frequency-domain voltage profile (U(f)) of said measured local power supply voltage (U(t));

calculating said local power supply impedance profile (|Z(f)|) from the magnitudes (|U(f)|, |I(f)|) of said voltage and current profiles (U(f), I(f)); and said power supply impedance profile being obtained by applying said repetitive activity at a single modulation frequency.

22. The method according to claim 21, wherein said analytic technique considers both odd-number and even-number harmonics of said single modulation frequency in order to evaluate said temporal behavior of a current consumption (I(t)).

23. The method according to claim 21, wherein said evaluating a temporal behavior of a current consumption (I(t)) comprises quasistatic measurements of a leakage current ($I_{leak}$) obtained without said repetitive activity being applied and an active current ($I_0$) obtained with said repetitive activity being applied.

24. A system for determining a local power supply impedance profile (|Z(f)|) at a predetermined load location within an electronic system, comprising:

means for applying a repetitive activity to said load location;

means for evaluating a temporal behavior of a current consumption (I(t)) caused by said repetitive activity at said load location using an analytic technique;

means for calculating a corresponding frequency-domain current consumption profile (I(f));

means for measuring a local power supply voltage (U(t)) caused by said repetitive activity at said load location;

means for evaluating a frequency-domain voltage profile (U(f)) of said measured local power supply voltage (U(t));

means for calculating said local power supply impedance profile (|Z(f)|) from the magnitudes (|U(f)|, |I(f)|) of said voltage and current profiles (U(f), I(f)); and said power supply impedance profile being obtained by said means for applying said repetitive activity applying said repetitive activity at a single modulation frequency.

25. The system according to claim 24, wherein said means for evaluating a temporal behavior of a current consumption (I(t)) uses an analytic technique that considers both odd-number and even-number harmonics of said single modulation frequency in order to evaluate said temporal behavior of a current consumption (I(t)).

* * * * *